(12) United States Patent
Okada et al.

(10) Patent No.: US 7,192,798 B2
(45) Date of Patent: Mar. 20, 2007

(54) FINGERPRINT SENSOR APPARATUS AND MANUFACTURING METHOD THEREOF

(75) Inventors: Akira Okada, Kawasaki (JP); Hideharu Sakoda, Kawasaki (JP); Michio Hayakawa, Kawasaki (JP); Fumihiko Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 722 days.

(21) Appl. No.: 10/289,268

(22) Filed: Nov. 7, 2002

(65) Prior Publication Data

US 2003/0156743 A1    Aug. 21, 2003

(30) Foreign Application Priority Data

Feb. 20, 2002    (JP)    ............................. 2002-043708

(51) Int. Cl.
*H01L 21/00*    (2006.01)
(52) U.S. Cl. .................. 438/51; 438/124; 257/680; 257/E29.324; 382/124
(58) Field of Classification Search ............... 438/50, 438/51, 124, 127; 257/E29.324, E21.502, 257/680, 710; 382/124; 264/272.17
See application file for complete search history.

(56) References Cited

U.S. PATENT DOCUMENTS

| 5,207,102 | A | 5/1993 | Takahashi et al. |
| 5,622,873 | A | 4/1997 | Kim et al. |
| 5,644,169 | A | 7/1997 | Chun |
| 6,289,114 | B1 | 9/2001 | Mainguet |
| 6,327,376 | B1 | 12/2001 | Harkin |
| 6,331,452 | B1 * | 12/2001 | Gall ........................... 438/127 |
| 6,815,262 | B2 * | 11/2004 | Hundt et al. ................ 438/127 |
| 6,960,790 | B2 * | 11/2005 | Miyai et al. .................. 257/77 |
| 2001/0042902 | A1 | 11/2001 | Wakabayashi et al. |

FOREIGN PATENT DOCUMENTS

| DE | 33 30 975 A1 | 3/1985 |
| EP | 0 789 334 A2 | 8/1997 |

OTHER PUBLICATIONS

European Search Report in corresponding European Patent Application EP 02 25 7538 dated Aug. 28, 2003.

\* cited by examiner

*Primary Examiner*—Caridad Everhart
(74) *Attorney, Agent, or Firm*—Westerman, Hattori, Daniels & Adrian, LLP.

(57) ABSTRACT

A fingerprint sensor apparatus can provide a normal fingerprint sensor function even when a mold flash is formed. The fingerprint sensor apparatus recognizes a pattern of a fingerprint by being contacted by a finger. A semiconductor chip has a surface on which a sensor part is formed. The semiconductor chip is encapsulated by a seal resin. The sensor part is exposed in a bottom of an opening formed in the seal resin part. A distance between an edge of the bottom of the opening and an edge of the sensor part is 0.3 mm to 0.1 mm.

10 Claims, 17 Drawing Sheets

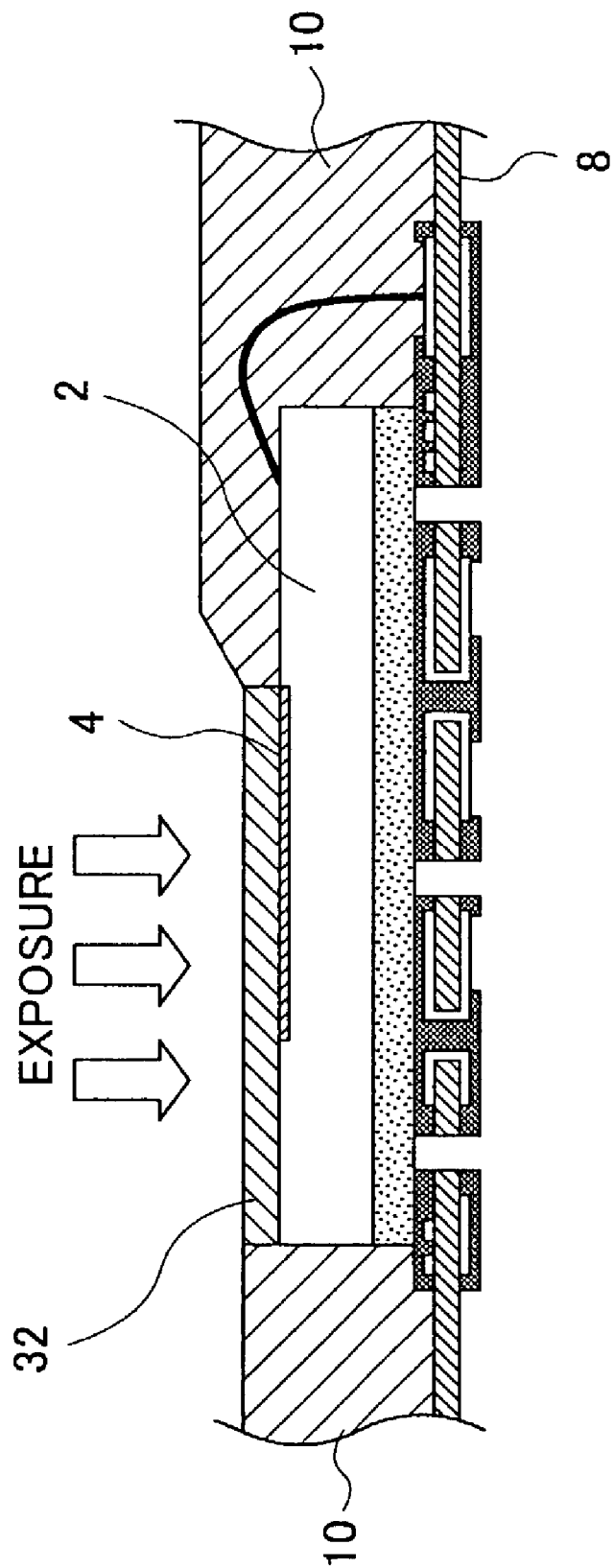

FINGERPRINT SENSOR APPARATUS AND MANUFACTURING METHOD THEREOF

BACKGROUND OF THE INVENTION

1. Field of the Invention

The present invention relates to fingerprint sensor apparatuses and, more particularly, to a fingerprint sensor apparatus in which a fingerprint sensor element formed on a semiconductor element is packaged in a state where the fingerprint sensor element is exposed on the surface of the finger sensor apparatus.

While electronic information communication spreads, a demand of performing individual recognition in electronic equipment is increasing so as to protect confidentiality of personal information. Although various techniques have been developed as personal identification means and put in practical use, a technique for discriminating fingerprints has attracted attention among them.

2. Description of the Related Art

A fingerprint sensor apparatus is an apparatus for recognizing a pattern of a fingerprint of a human finger. In order to develop a small fingerprint sensor apparatus, a semiconductor chip for a fingerprint sensor having a fingerprint sensor part formed thereon has been developed. Generally, the fingerprint sensor part is composed of a pressure sensor or a capacitance sensor, and processes information from a sensor part by a semiconductor chip so as to perform recognition and discrimination of a fingerprint. Such a semiconductor chip for a fingerprint sensor is encapsulated by a seal resin similar to regular semiconductor chips, and is incorporated into electronic equipment as a fingerprint sensor semiconductor device.

FIG. 1 is a cross-sectional view showing a resin encapsulation process in a production process of a conventional fingerprint sensor apparatus. A semiconductor element 2 for fingerprint sensors has a sensor part 4 in a circuit forming surface thereof, and electrodes are arranged around the sensor part 4. The electrodes are wire-bonded by gold wires 6 or the like to electrode pads 8a of a circuit board 8 as an interposer. The semiconductor chip 2 and the gold wires 6 are molded by a seal resin, and, thus, a seal resin part 10 is formed.

The sensor part 4 is a part on which a finger is contacted directly so as to recognize a fingerprint, and needs to be exposed from the seal resin part 10. Therefore, as shown in FIG. 1, when the semiconductor chip 2 is molded by a mold die 12, a spacer 14 is provided between the mold die 12 and the sensor part 4 so as to press the spacer 14 against the sensor part 4 so that the seal resin does not cover the surface of the sensor part 4.

The spacer 14 is formed by a material such as rubber or plastic which has elasticity to some extent, and is pressed against the sensor part 4 by the mold die 12. Thereby, the seal resin is prevented from flowing onto the surface of the sensor part during the molding process.

According to the approach of making the sensor part 4 in into the exposed state by pressing the spacer 14 during the molding process, the sensor part 4 may be damaged when the spacer 14 is pressed against the sensor part 4 if the spacer does not have an elasticity to some extent. However, if the sensor part 4 has elasticity, the seal resin may enter between the sensor part 4 and the spacer 14 due to a resin mold pressure.

FIG. 2 is a cross-sectional view of the fingerprint sensor apparatus, which is molded in a state where the seal resin enters between the sensor part 4 and the spacer 14. Opening 10a of the seal resin part 10 is formed in a part at which the spacer 14 was placed during the molding process, and the sensor part 4 is exposed within the opening 10a.

However, as shown in FIG. 2, the seal resin which entered between the sensor part 4 and the spacer 14 serves as a mold flash 16, and adheres to the surface of the sensor part 4. For this reason, a part of the surface of the sensor part 4 is covered by the mold flash 16, and such a part may lose the function as the sensor part. That is, the area of the part, which provides the functions as a sensor part 4, may be reduced.

If the fingerprint sensor is of a so-called area type in which the sensor part 4 has a relatively large area, the remaining uncovered part can maintain the function as the sensor part since a ratio of the part covered by the mold flash is small. However, in a case of a so-called sweep-type fingerprint sensor, which reads a fingerprint by the sensor part being wiped by a finger, a width H of the sensor part 4 is very as small as 1 mm. Generally, a length L of a mold flash is 0.3 mm–0.5 mm, and a large part of the sensor part 4 may be covered by the mold flash, which results in fail in the function of the sensor part.

Additionally, in the case of the sweep-type fingerprint sensor, is a height of the resin surrounding the exposed part of the sensor part 4 is high, there is also a problem in that an operation to wipe (sweep) by a finger becomes difficult while the finger contacts the sensor part 4.

SUMMARY OF THE INVENTION

It is a general object of the present invention to provide an improved and useful fingerprint sensor apparatus in which the above-mentioned problems are eliminated.

A more specific object of the present invention is to provide a fingerprint sensor apparatus which can provide a normal fingerprint sensor function even when a mold flash is formed.

Another object of the present invention is to provide a sweep-type fingerprint sensor which can provide an easy finger movement by reducing a resin part surrounding a sensor part.

In order to achieve the above-mentioned objects, there is provided according to one aspect of the present invention a fingerprint sensor apparatus for recognizing a pattern of a fingerprint by being contacted by a finger, comprising: a semiconductor chip having a surface on which a sensor part is formed; and a seal resin part which encapsulates the semiconductor chip, wherein the sensor part is exposed in a bottom of an opening formed in the seal resin part, and a distance between an edge of the bottom of the opening and an edge of the sensor part is 0.3 mm to 0.1 mm.

According to the above-mentioned invention, when the semiconductor chip is resin-molded while the spacer is pressed against the sensor part so as to expose the sensor part, and if the resin enters between the sensor part and the semiconductor chip and a mold flash is formed, the mold flash does not reach the sensor part, which maintains a normal function of the sensor part.

Additionally, there is provided according to another aspect of the present invention a fingerprint sensor apparatus for recognizing a pattern of a fingerprint by being contacted by a finger, comprising: a semiconductor chip having a surface on which a sensor part is formed; and a seal resin part which encapsulates the semiconductor chip, wherein the sensor part is exposed in a bottom of an opening formed in the seal resin part; the bottom of the opening has a step formed by a first surface and a second surface which is higher than the first surface, the sensor part being exposed on the first surface; and a distance between the first surface and the second surface in a direction perpendicular to a surface of the sensor part is 70 μm to 150 μm.

According to the above-mentioned invention, the bottom of the opening has a two-stage structure, and the thickness of the portion of the seal resin part surrounding the sensor part is smaller than other portions. Thus, a resin-filling pressure is reduced when the seal resin is filled in a space corresponding to the portion having the reduced thickness, thereby preventing occurrence of a mold flash.

Further, there is provided according to another aspect of the present invention a fingerprint sensor apparatus for recognizing a pattern of a fingerprint by being contacted by a finger, comprising: a semiconductor chip having a surface on which a sensor part is formed; and a seal resin part which encapsulates the semiconductor chip, wherein the sensor part and a part of a surface of the semiconductor chip are exposed in a bottom of an opening formed in the seal resin part, and a portion of the seal resin part forming the opening in a direction in which the finger is moved is a flat surface within the same plane in which an exposed surface of the semiconductor chip lies.

According to the above-mentioned invention, when a finger is moved (scanned) along the sensor part while the finger contacts the sensor part, there is no seal resin part, which may be an obstacle with respect to the movement of the finger. Thus, a fingerprint recognition operation can be smoothly carried out, and an accurate recognition can be maintained.

In the above-mentioned fingerprint sensor apparatus, a protrusion may be formed as a part of the seal resin part, the protrusion extending astride and along a boundary between the exposed surface of the semiconductor chip and the flat surface of the seal resin part. Accordingly, since the edge of the semiconductor chip is covered by the protrusion of the seal resin part, the edge of the semiconductor chip, which is easily chipped or cracked, is protected.

Additionally, there is provided according to another aspect of the present invention a fingerprint sensor apparatus for recognizing a pattern of a fingerprint by being contacted by a finger, comprising: a semiconductor chip having a surface on which a sensor part is formed; and a seal resin part which encapsulates the semiconductor chip, wherein the sensor part and a part of a surface of the semiconductor chip are exposed in a bottom of an opening formed in the seal resin part, and a portion of the seal resin part forming the opening in a direction in which the finger is moved is lower than other portions of the seal resin part but higher than an exposed surface of the semiconductor chip.

According to the above-mentioned invention, the portion of the seal resin part in the direction of movement of the finger is formed lower than other portions. Thus, when the finger is moved (scanned) along the sensor part while the finger contacts the sensor part, a fingerprint recognition operation can be smoothly carried out, and an accurate recognition can be maintained.

Additionally, there is provided according to another aspect of the present invention a manufacturing method of a fingerprint sensor apparatus for recognizing a pattern of a fingerprint by being contacted by a finger, comprising the steps of: attaching a spacer onto a predetermined position of a mold die for resin-molding a semiconductor chip having a surface on which a sensor part is formed, the spacer having a width greater than a width of the sensor part by a predetermined length; and placing the semiconductor chip inside the mold die, and resin-molding the semiconductor chip in a state where the spacer covers the sensor part of the semiconductor chip.

According to the above-mentioned invention, when the semiconductor chip is resin-molded while the spacer is pressed against the sensor part so as to expose the sensor part, and if the resin enters between the sensor part and the semiconductor chip and a mold flash is formed, the mold flash does not reach the sensor part, which maintains a normal function of the sensor part.

In the above-mentioned manufacturing method, the spacer may cover an entire width of the sensor part, and a portion of the spacer extending beyond an edge of the sensor part in a direction of the width may be 0.3 mm to 1.0 mm. Accordingly, if the resin enters between the sensor part and the semiconductor chip through the edge of the spacer and a mold flash is formed, the mold flash does not reach the sensor part since the mold flash generally has a length equal to less than 0.3 mm. Thus, a normal function of the sensor part is maintained.

Additionally, the spacer may cover an entire width of the sensor part, and a portion of the spacer extending beyond an edge of the sensor part may extend beyond an edge of a surface of the semiconductor chip. Accordingly, the upper surface of the semiconductor chip continuing from the sensor part is exposed. Thus, when the finger is moved (scanned) along the sensor part while the finger contacts the sensor part, a fingerprint recognition operation can be smoothly carried out, and an accurate recognition can be maintained.

Additionally, there is provided according to another aspect of the present invention a manufacturing method of a fingerprint sensor apparatus for recognizing a pattern of a fingerprint by being contacted by a finger, comprising the steps of: applying a protective film having a predetermined thickness over a portion of a surface of a semiconductor chip and a sensor part formed on the surface of the semiconductor chip; placing the semiconductor chip inside the mold die, and resin-molding the semiconductor chip in a state where the protective tape covers the sensor part of the semiconductor chip; and removing the protective film from the semiconductor chip by pealing after the resin-molding so as to expose the sensor part and the portion of the surface of the semiconductor chip.

According to the above-mentioned invention, the sensor part and the upper surface of the semiconductor chip can be easily exposed by merely resin-molding the semiconductor chip after applying the protective tape on the sensor part and the surrounding part.

Additionally, there is provided according to another aspect of the present invention a manufacturing method of a fingerprint sensor apparatus for recognizing a pattern of a fingerprint by being contacted by a finger, comprising the steps of: forming a photosensitive resin film having a predetermined thickness over a portion of a surface of a semiconductor chip and a sensor part formed on the surface of the semiconductor chip; placing the semiconductor chip inside the mold die, and resin-molding the semiconductor chip in a state where the photosensitive resin film covers the sensor part of the semiconductor chip; and removing the protective film from the semiconductor chip by exposure after the resin-molding so as to expose the sensor part and the portion of the surface of the semiconductor chip.

According to the above-mentioned invention, the sensor part and the upper surface of the semiconductor chip can be easily exposed by merely resin-molding the semiconductor chip after forming the photosensitive film on the sensor part and the surrounding part.

Other objects, features and advantages of the present invention will become more apparent from the following detailed description when read in conjunction with the accompanying drawings.

BRIEF DESCRIPTION OF THE DRAWINGS

FIG. 17 is a cross-sectional view showing a process of exposure after resin-molding in the production process of the fingerprint sensor apparatus shown in FIG. 10.

DETAILED DESCRIPTION OF THE PREFERRED EMBODIMENTS

Figure 1:
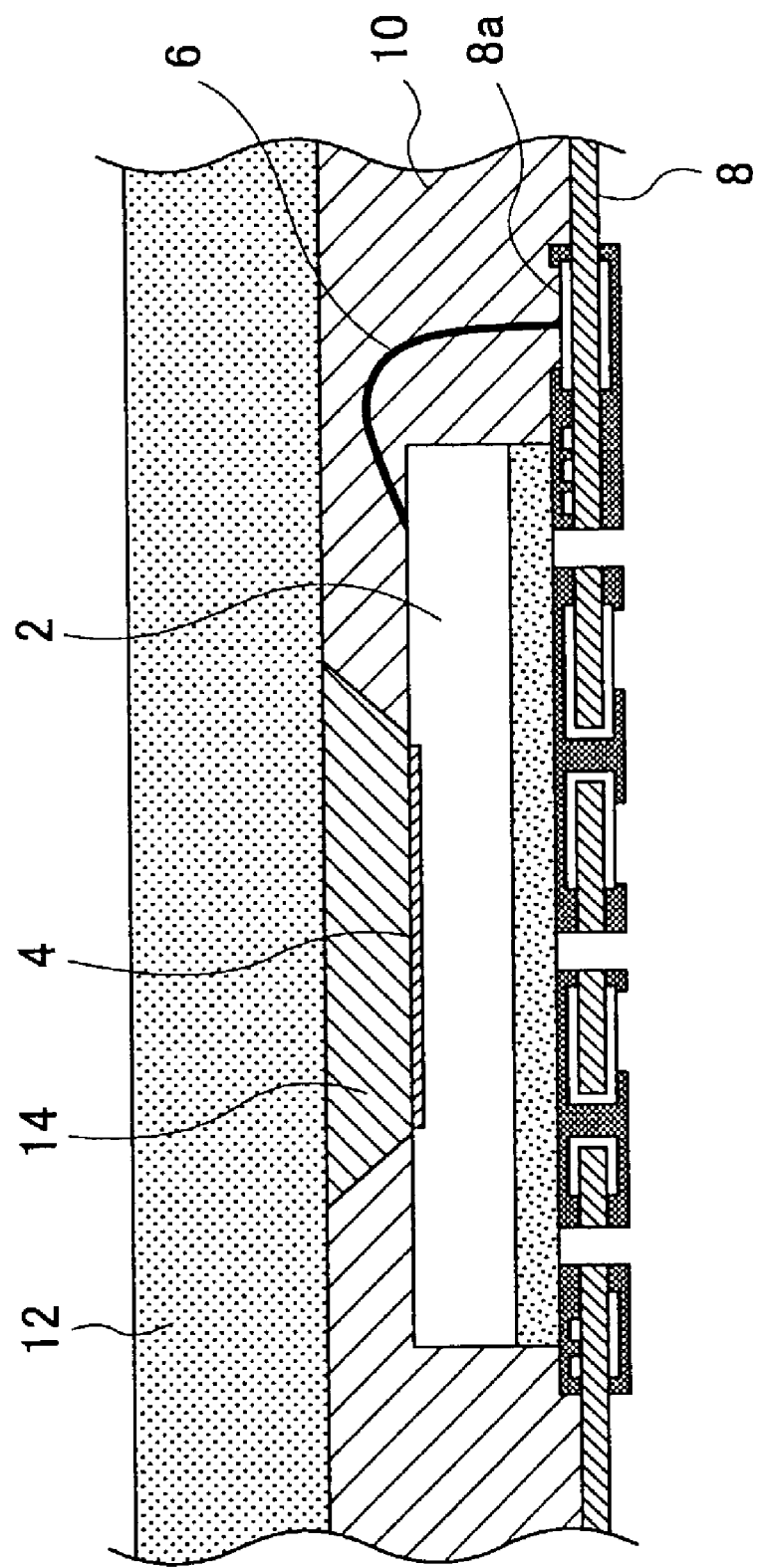
FIG. 1 is a cross-sectional view showing a resin encapsulation process in a production process of a conventional fingerprint sensor apparatus.
Figure 2:
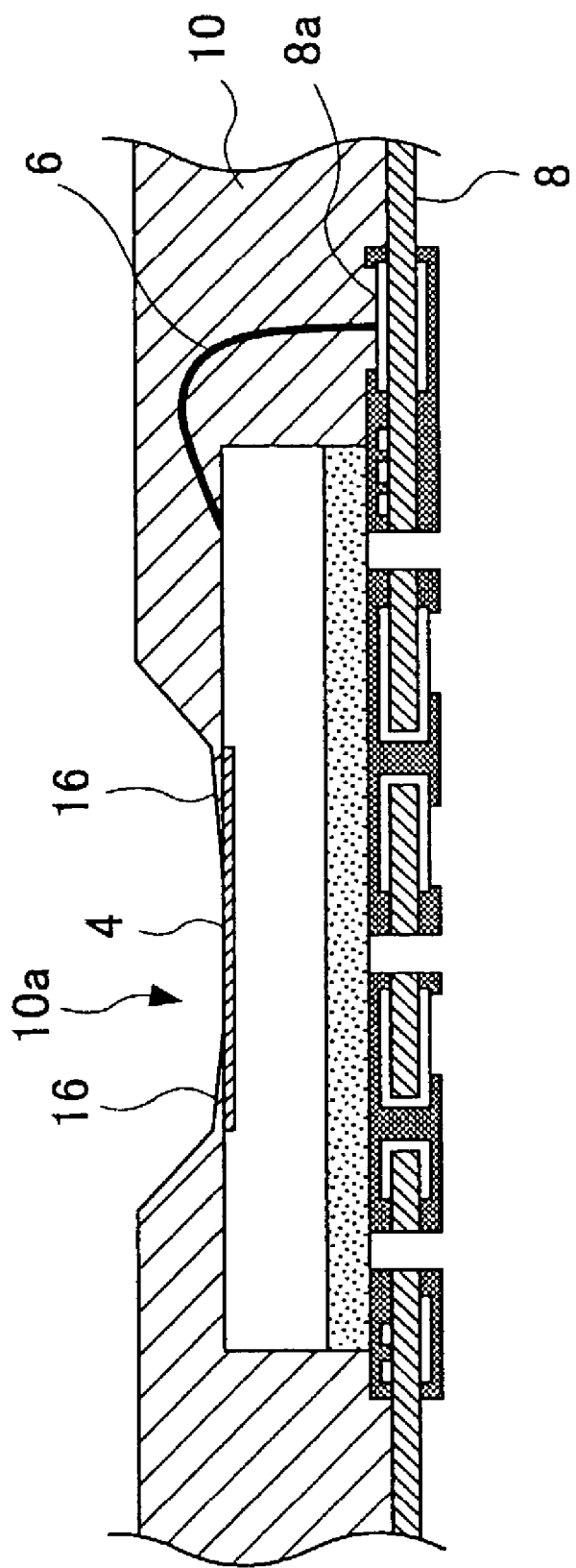
FIG. 2 is a cross-sectional view of a fingerprint sensor apparatus, which is molded in a state where a seal resin enters between a sensor part and a spacer.
Figure 3:
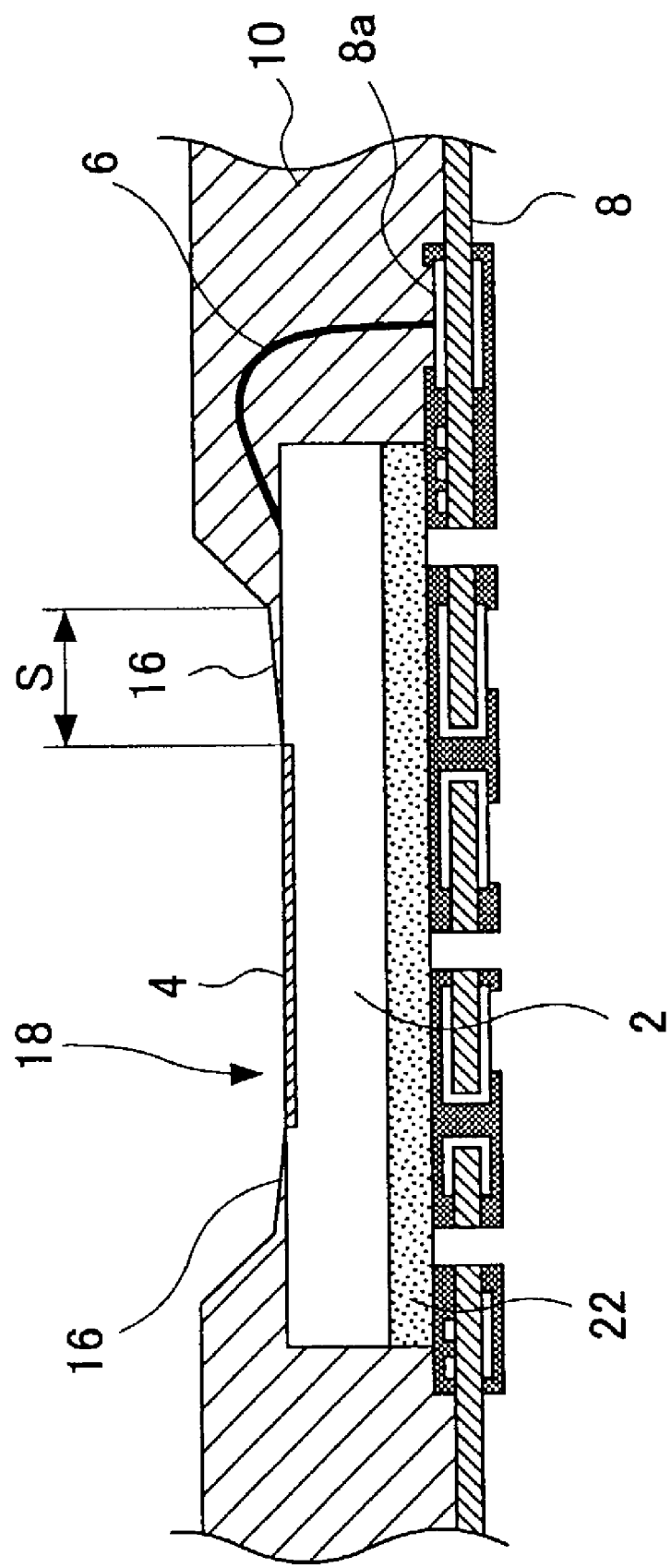
FIG. 3 is a cross-sectional view of a fingerprint sensor apparatus according to a first embodiment of the present invention.

A description will now be give, with reference to FIG. 3, of a first embodiment of the present invention. FIG. 3 is a cross-sectional view of a fingerprint sensor apparatus according to the first embodiment of the present invention. In FIG. 3, parts that are the same as the parts shown in FIG. 2 are given the same reference numerals, and descriptions thereof will be omitted.

The fingerprint sensor apparatus according to the first embodiment of the present invention differs from the fingerprint sensor shown in FIG. 2 with respect to the point of having an opening 18 larger than the opening 10a formed on the upper surface of the seal resin part 10 of the fingerprint sensor apparatus shown in FIG. 2.

The basic structure of the fingerprint sensor apparatus shown in FIG. 3 is the same as the structure of the fingerprint sensor shown in FIG. 2, and the semiconductor chip 2 fixed by a die attachment material 22 onto a circuit board is molded by a seal resin. The opening 18 is formed in the seal resin part 10, and the sensor part 4 of the semiconductor chip 2 is exposed in the bottom of the opening 18.

Figure 4:
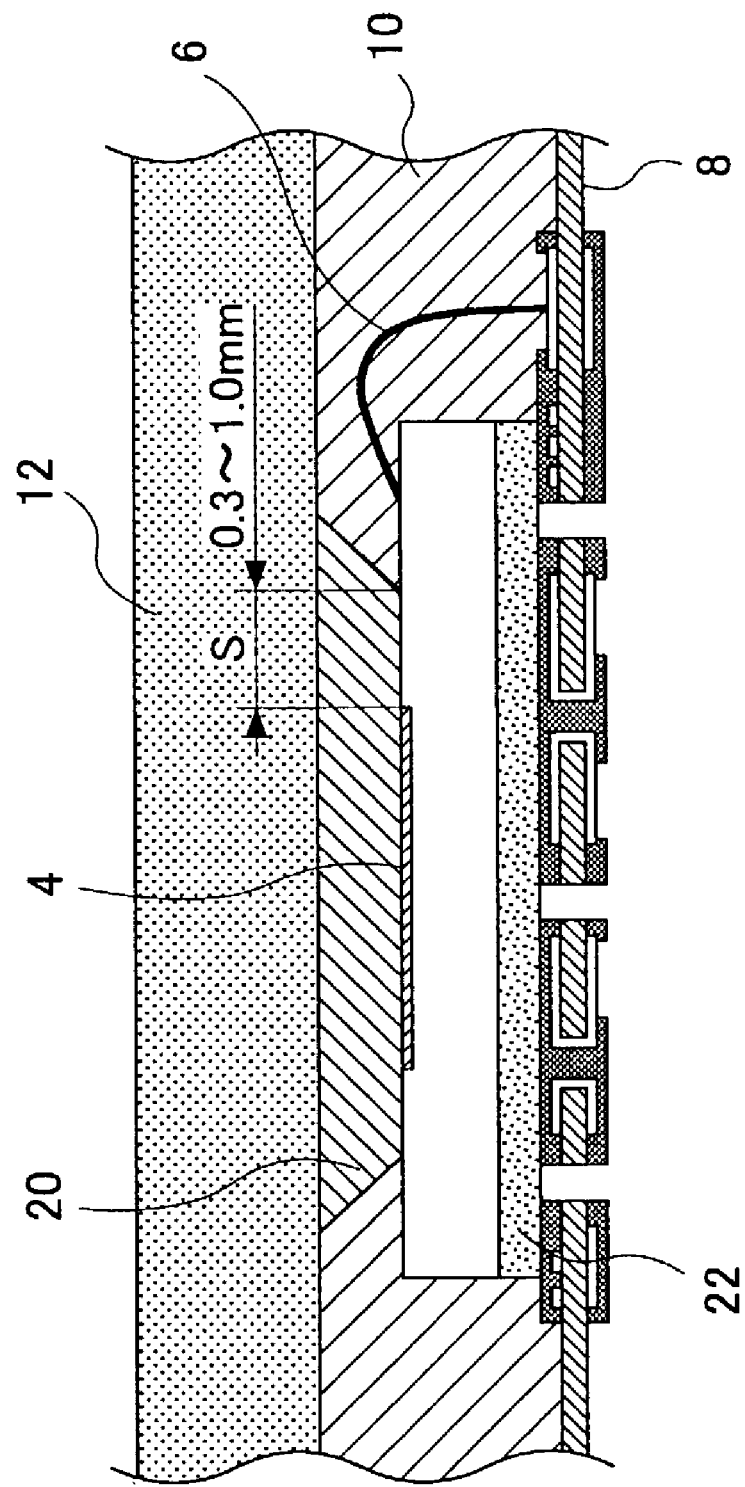
FIG. 4 is a cross-sectional view showing a process of resin-molding a semiconductor chip in a production process of the fingerprint sensor apparatus shown in FIG. 3.

FIG. 4 is a cross-sectional view showing a process of encapsulating the semiconductor chip 2 by the seal resin in a production process of the fingerprint sensor apparatus shown in FIG. 3. The opening 18 of the seal resin part 10 is formed by placing a spacer 20 inside a mold die. The fingerprint sensor apparatus according to the present embodiment has a flat configuration of 4.5 mm×14 mm, and the semiconductor chip 2 has a flat configuration of 3 mm×13 mm. The sensor part 4 is formed in an elongated area having a width of about 1 mm. The sensor part 4 shown in FIG. 3 and FIG. 4 is indicated by a cross section in a direction of a width of the sensor part 4.

As shown in FIG. 4, when the semiconductor chip 2 is resin-molded, the spacer 20 is attached to the mold die 12 so that the spacer 20 is positioned between the mold die 12 and the sensor part 4. A part into which the seal resin does not flow due to the spacer 20 corresponds to the opening 18. That is, the seal resin part is removed from the mold die 12, the opening 18 is formed in the position where the spacer 20 was present, and the sensor part 4 is exposed in the bottom of the opening 18.

The spacer 20 is formed by a material having elasticity like a heat-resistant plastic such as a polyimide resin or a heat-resistant rubber such as a silicone rubber, and is attached to a predetermined part of the mold die 12. The depth of the opening 18 of the resin seal part 10 is about 0.2 mm, and the thickness of the spacer 20 is set to a value slightly larger than 0.2 mm in consideration of compressibility.

Here, the width of the spacer 20 (a dimension of the sensor part in the direction of width) is about 2 times of the width of the sensor part 4. Therefore, a circumference part of the sensor part 4 is exposed on both sides of the sensor part 4 in the direction of width of the sensor part 4. Specifically, the dimension of the spacer 20 in the direction of width is set so that a distance S between an end of the sensor part 4 in the direction of width and an end of the spacer 20 is 0.3 mm to 1.0 mm as shown in FIG. 4.

Even in the case where the opening 18 is formed by the spacer 20 of the above-mentioned dimension, there is a possibility that a mold flash as shown in FIG. 2 may be formed. However, as mentioned above, since the length of the mold flash is about 0.3 mm–0.5 mm from the end of the spacer, the mold flash does not reach the sensor part 4 even if the mold flash is formed, as shown in FIG. 3. Therefore, the sensor part 4 is prevented from loosing the function as a sensor part due to the mold flash 16 covering the sensor part 4.

Since the width of the semiconductor chip is about 4 mm, if the above-mentioned dimension S exceeds 1 mm, it will become impossible to carry out resin encapsulation of the electrodes of the semiconductor chip 2 formed on the same surface as the sensor part 4. It is preferable to set the above-mentioned distance S to 0.3 mm–1.0 mm based on the above-mentioned restrictions on dimensions. Here, a start point of the distance S is determined as a position corresponding to the end of the spacer 20, that is, an end of the bottom of the opening 18 when a mold flash is not formed.

Figure 5:
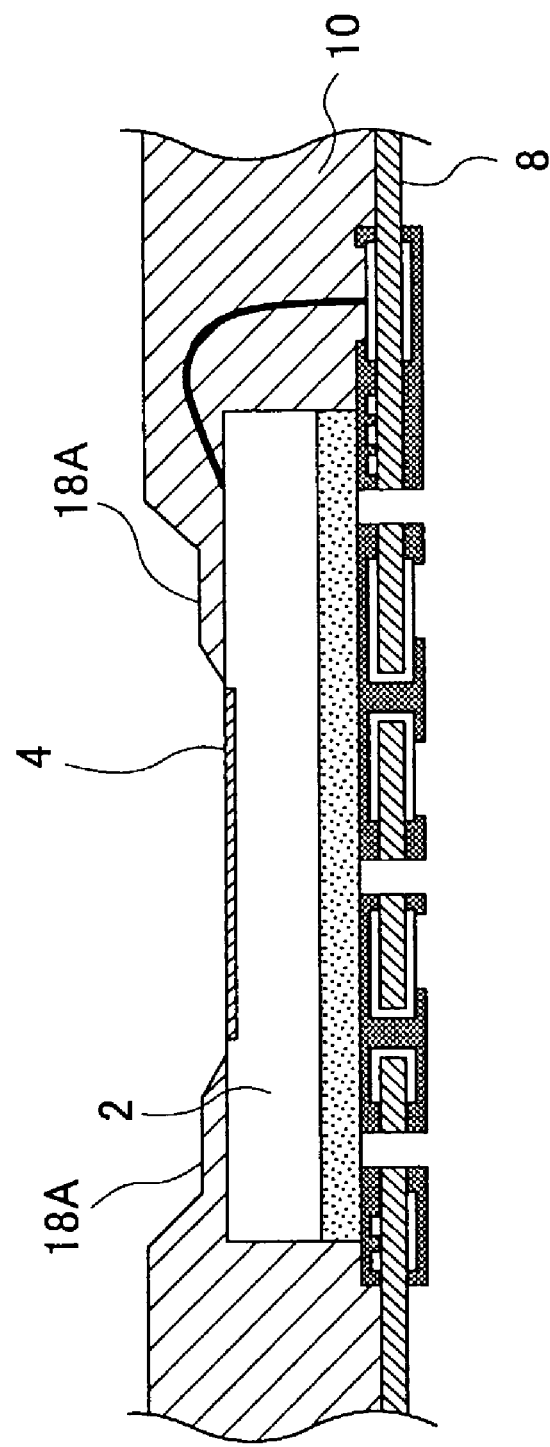
FIG. 5 is a cross-sectional view of a fingerprint sensor apparatus according to a second embodiment of the present invention.
Figure 6:
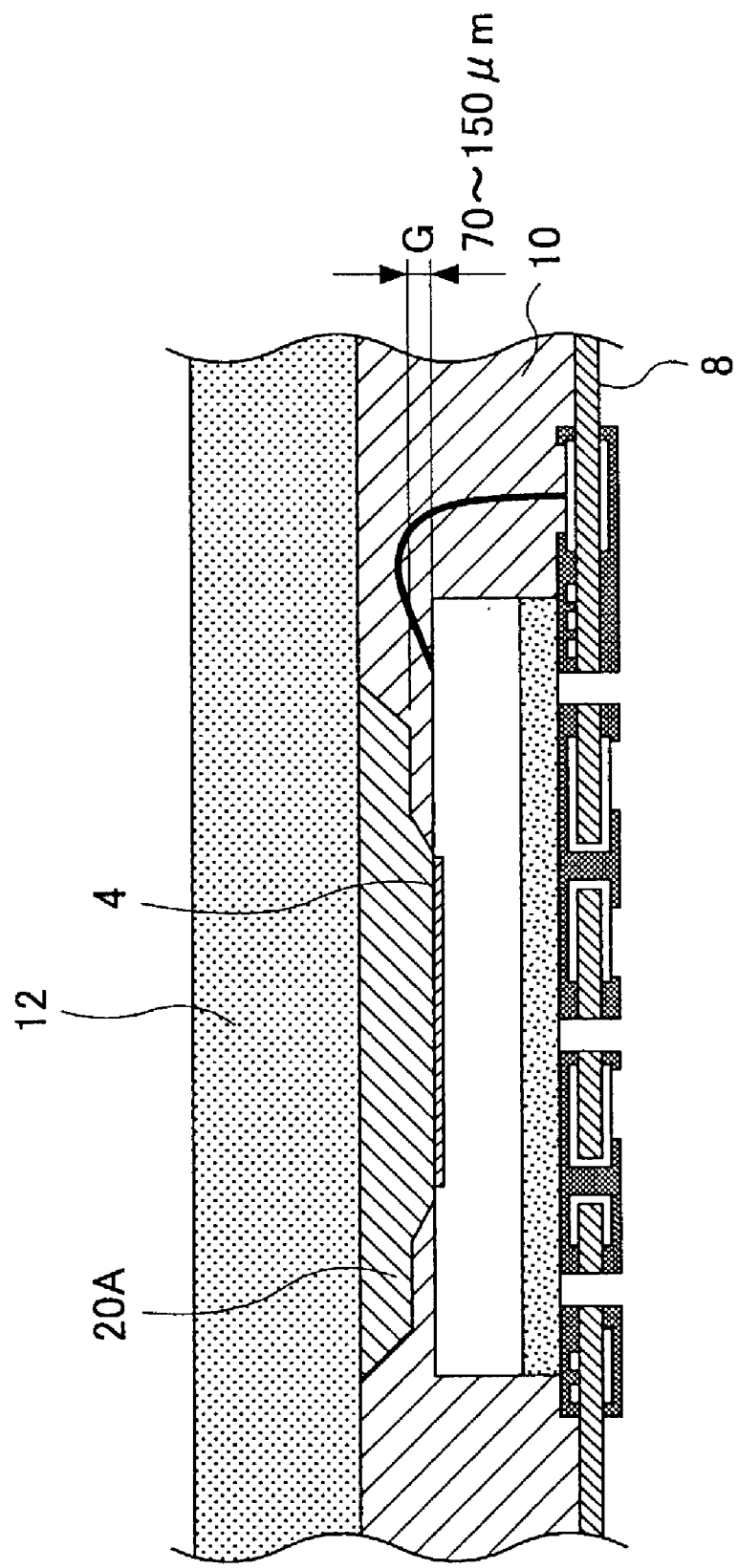
FIG. 6 is a cross-sectional view showing a process of resin-molding a semiconductor chip in a production process of the fingerprint sensor apparatus shown in FIG. 5.

A description will now be given, with reference to FIG. 5 and FIG. 6, of a second embodiment of the present invention. FIG. 5 is a cross-sectional view of a fingerprint sensor apparatus according to the second embodiment of the present invention. FIG. 6 is a cross-sectional view showing a process of resin-molding the semiconductor chip 2 in a production process of the fingerprint sensor apparatus shown in FIG. 5.

The fingerprint sensor apparatus according to the second embodiment of the present invention has the same structure as the fingerprint sensor apparatus according to the first embodiment shown in FIG. 3 except for the configuration of the opening formed in the resin seal part. In the present embodiment, the configuration of the opening has a step in the bottom thereof as shown in FIG. 5 so that a step part 18A having a height of 70 micron to 150 micron is formed around the exposed surface of the sensor part 4.

In order to form the step part 18A, the spacer 20A is formed as a two-step configuration, as shown in FIG. 6. That is, the surface of the upper stage of the spacer 20A contacts the sensor part 4 and is pressed, and the surface around the upper stage is located 70 μm–150 μm below the upper stage surface. When the resin-molding is carried out using the thus-formed spacer 20A, the seal resin flows into a gap space G of 70 μm to 150 μm formed between the lower stage surface and the surface of the semiconductor chip 2, thereby forming the step part 18A as shown in FIG. 5.

Here, when the seal resin flows into the gap G, a pressure of resin flowing into the gap G rapidly decreases since the gap G is small. Thus, when the seal resin reaches the deepest part of the gap, i.e., near the end of the sensor part 4, the pressure of the seal resin becomes very small, and, thus, the seal resin cannot enter between the spacer 20A and the sensor part 4. Therefore, it can be prevented that a mold flash is formed by the seal resin entering between the spacer 20A and the sensor part 4.

If the width of the gap G, that is, the height of the step part 18A from the sensor part 4 is too small, the seal resin cannot flow into the gap G. On the other hand, if the height of step par is too large, a pressure loss is small and the seal resin maintains a pressure sufficient to form a mold flash. If the seal resin is that normally used for transfer molding and if the gap G is 70 μm to 150 μm, the seal resin can reach the deepest part of the gap while a pressure of the seal resin is decreased appropriately. Therefore, without producing a mould flash in the bottom of the opening 18 of the seal resin part 10, the entire surface of the semiconductor chip 2 can be encapsulated by the seal resin with the sensor part 4 being uncovered.

Figure 7:
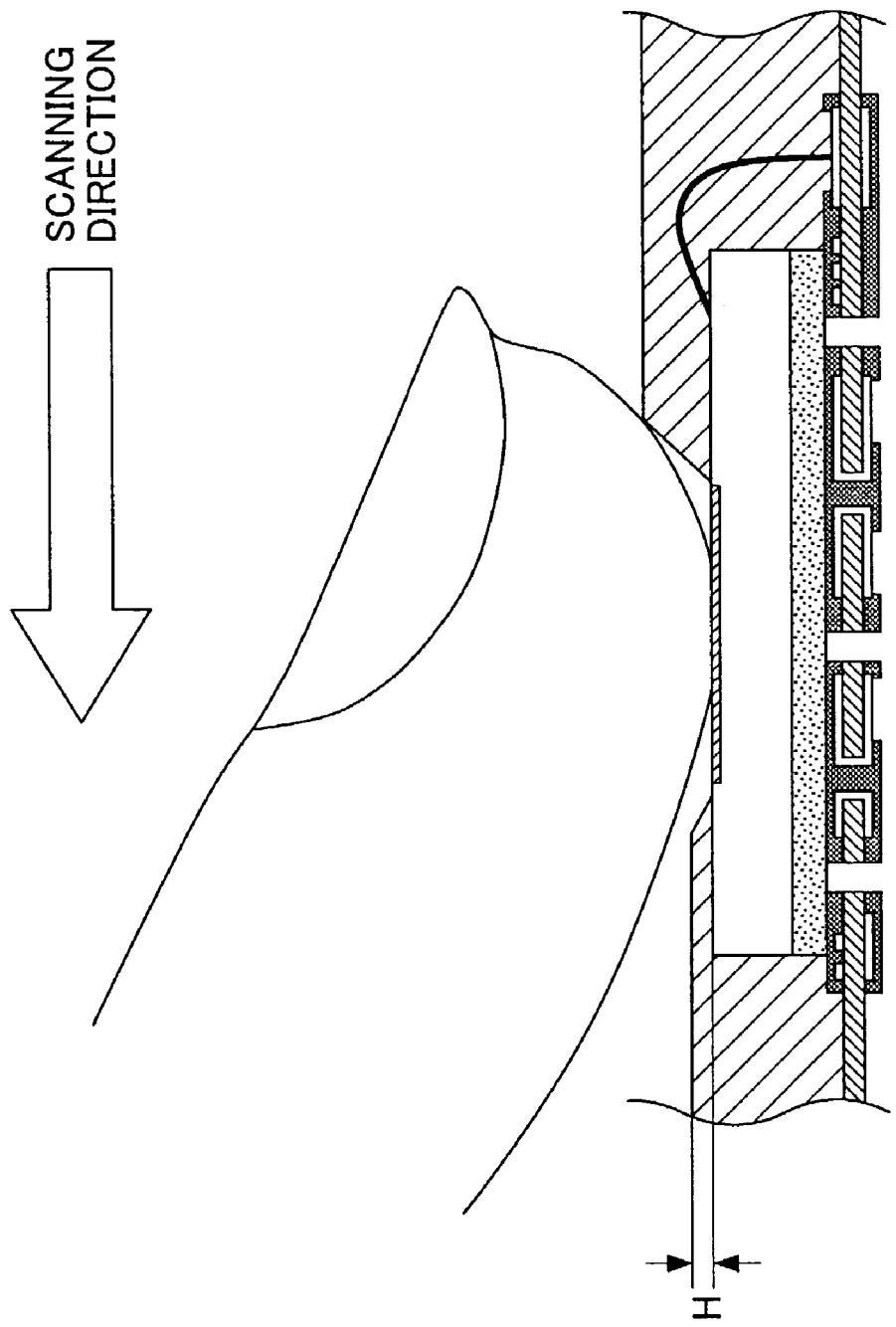
FIG. 7 is a cross-sectional view for explaining a sweep-type fingerprint sensor apparatus.

A description will now be given of a fingerprint sensor apparatus according to a third embodiment of the present invention. The fingerprint sensor apparatus according to the third embodiment is particularly related to a sweep-type fingerprint sensor apparatus. First, the sweep-type fingerprint sensor apparatus is explained with reference to FIG. 7.

The sweep-type fingerprint sensor apparatus is a sensor, which recognizes a pattern of a fingerprint by moving a finger having a fingerprint while contacting the finger with a sensor part. A capacitance sensor may be used as a sensor part, and, in such a case, an individual fingerprint pattern is recognized by carrying out an operation on a change in capacitance due to a movement of unevenness corresponding to the fingerprint when moving a finger. Therefore, if the height H of the part surrounding the opening in which the sensor part is exposed is large, it is difficult to move the finger while contacting a finger with the sensor part. For this reason, it is preferable that the surrounding part of the opening in the direction of movement of the finger is maintained as low as possible.

Figure 8:
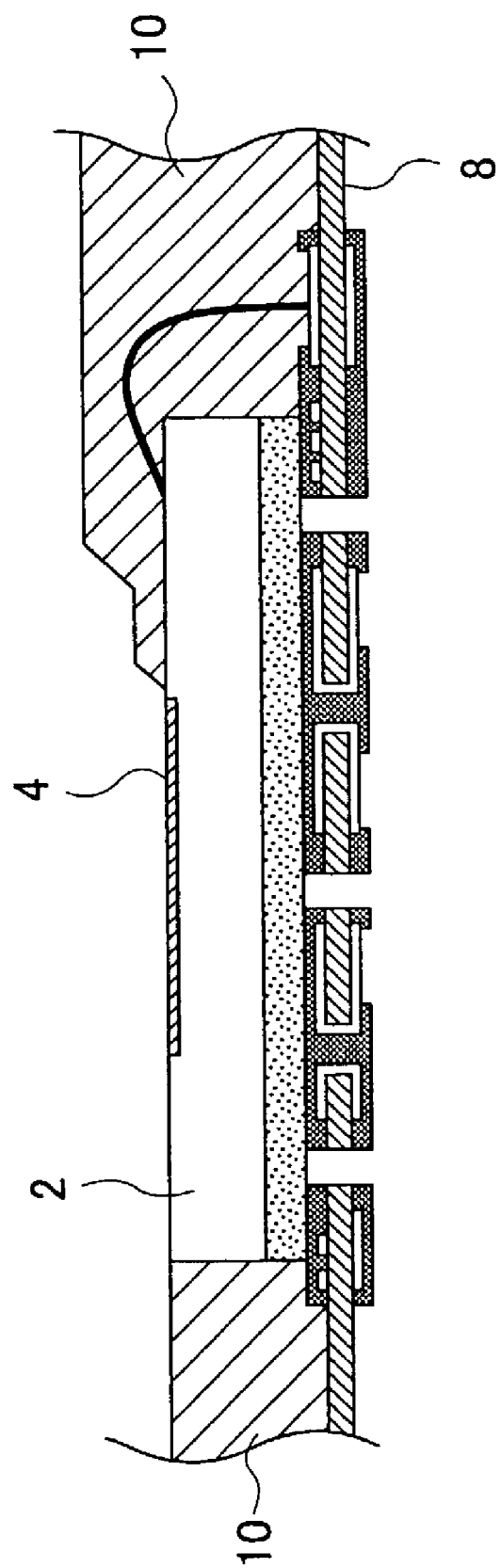
FIG. 8 is a cross-sectional view of a fingerprint sensor apparatus according to a third embodiment of the present invention.
Figure 9:
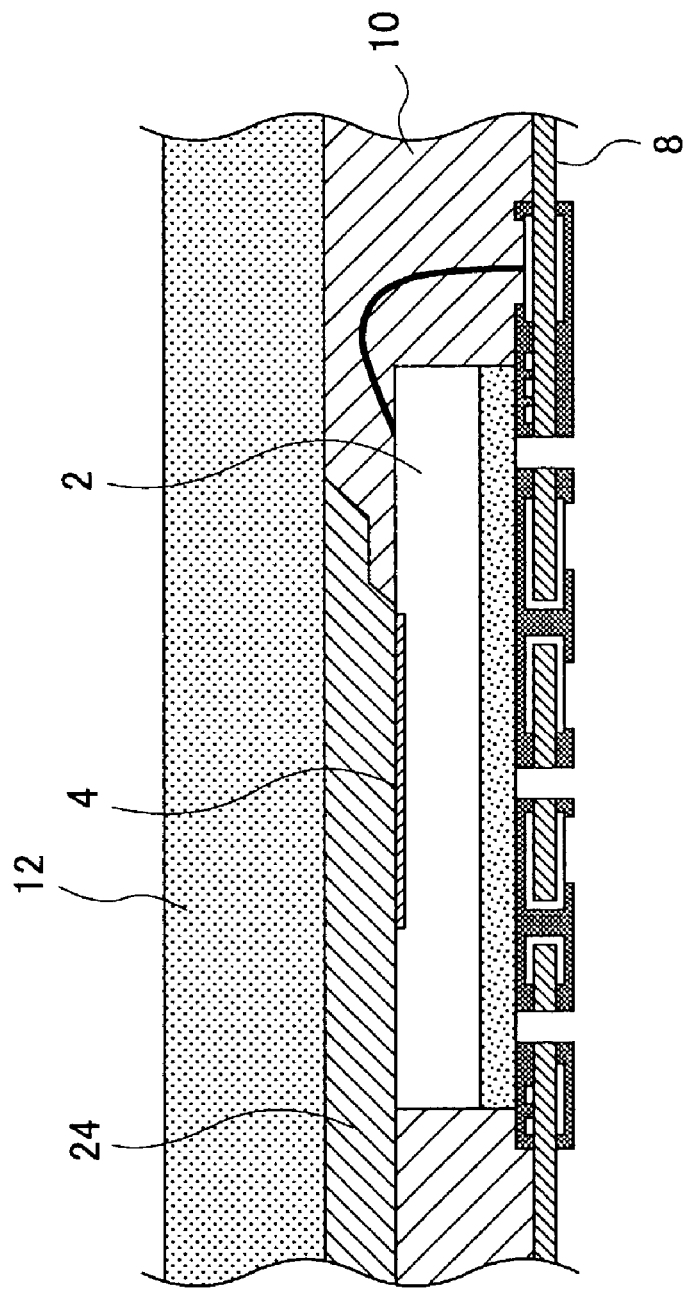
FIG. 9 is a cross-sectional view showing a process of resin-molding a semiconductor chip in a production process of the fingerprint sensor apparatus shown in FIG. 8.

FIG. 8 is a cross-sectional view of the fingerprint sensor apparatus according to the third embodiment of the present invention. FIG. 9 is a cross-sectional view showing a process of resin-molding the semiconductor chip 2 in a production process of the fingerprint sensor apparatus shown in FIG. 8. In FIG. 8 and FIG. 9, parts that are the same as the parts shown in FIG. 5 and FIG. 6 are give the same reference numerals, and descriptions thereof will be omitted.

In the sweep-type fingerprint sensor according to the third embodiment of the present invention, the semiconductor chip 2 is encapsulated by the seal resin in a state where the surface of the semiconductor chip 2 is exposed on a downstream side of the sensor part in the scanning direction. That is, the semiconductor chip 2 is encapsulated by the seal resin in a state where the seal resin in a surrounding part of the opening 18B on the downstream side of the sensor part 4 in the scanning direction is removed. It should be noted that a protective film is preferably formed on an exposed part of the upper surface of the semiconductor chip.

The above-mentioned opening 18B can be formed by attaching a spacer 24 to the mold die 12, as shown in FIG. 9, so that the spacer 24 extends on the downstream side of the sensor part 4 in the scanning direction. The spacer 24 is configured and arranged to cover the upper surface of the semiconductor chip 2 to be encapsulated and extend further on the downstream side. Therefore, when scanning a finger for fingerprint recognition, the finger can be smoothly moved without any resistance, thereby improving an accuracy of fingerprint recognition.

Figure 10:
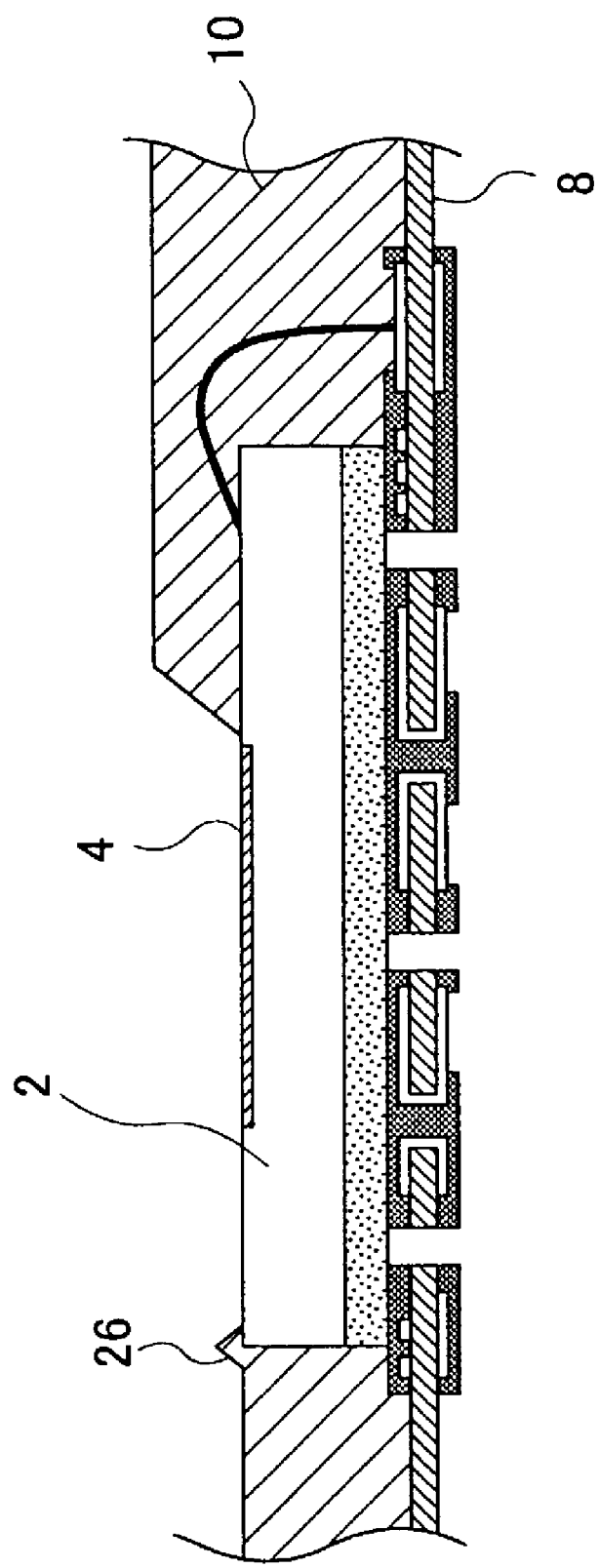
FIG. 10 is a cross-sectional view showing a variation of the fingerprint sensor apparatus according to the third embodiment.
Figure 11:
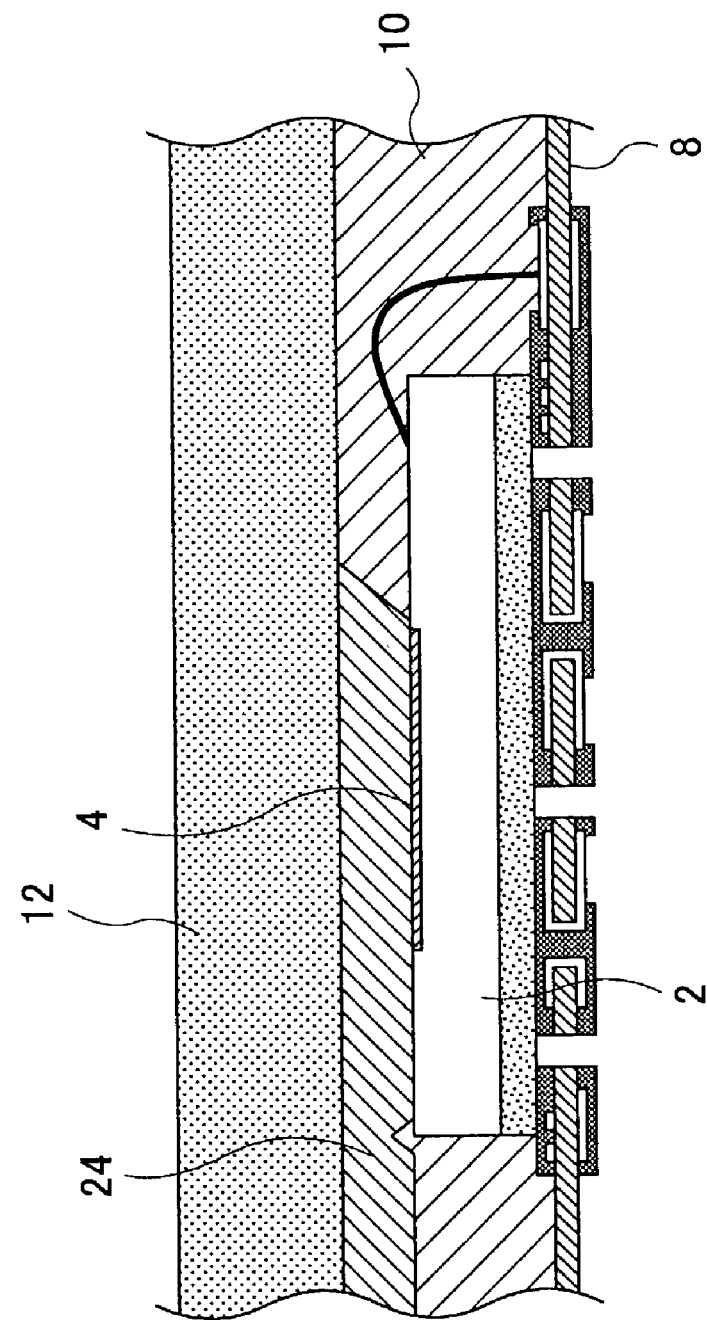
FIG. 11 is a cross-sectional view showing a process of resin-molding a semiconductor chip in a production process of the fingerprint sensor apparatus shown in FIG. 10.

FIG. 10 is a cross-sectional view showing a variation of the fingerprint sensor apparatus according to the above-mentioned third embodiment. FIG. 11 is a cross-sectional view showing a process of resin-molding the semiconductor chip in a production process of the fingerprint sensor apparatus shown in FIG. 10.

The fingerprint sensor apparatus shown in FIG. 10 is provided with a protrusion 26 which is formed by the seal resin so as to slightly protrude along a boundary part between the semiconductor chip 10 and the seal resin part 10. The protrusion 26 can be easily formed by providing a notch in the spacer 24, the notch being configured to correspond to the configuration of the protrusion 26 as shown in FIG. 11. The protrusion 26 is provided at a location to cover the edge of the semiconductor chip 2, and serves to prevent the edge of the semiconductor chip 2 from being chipped or damaged.

Figure 12:
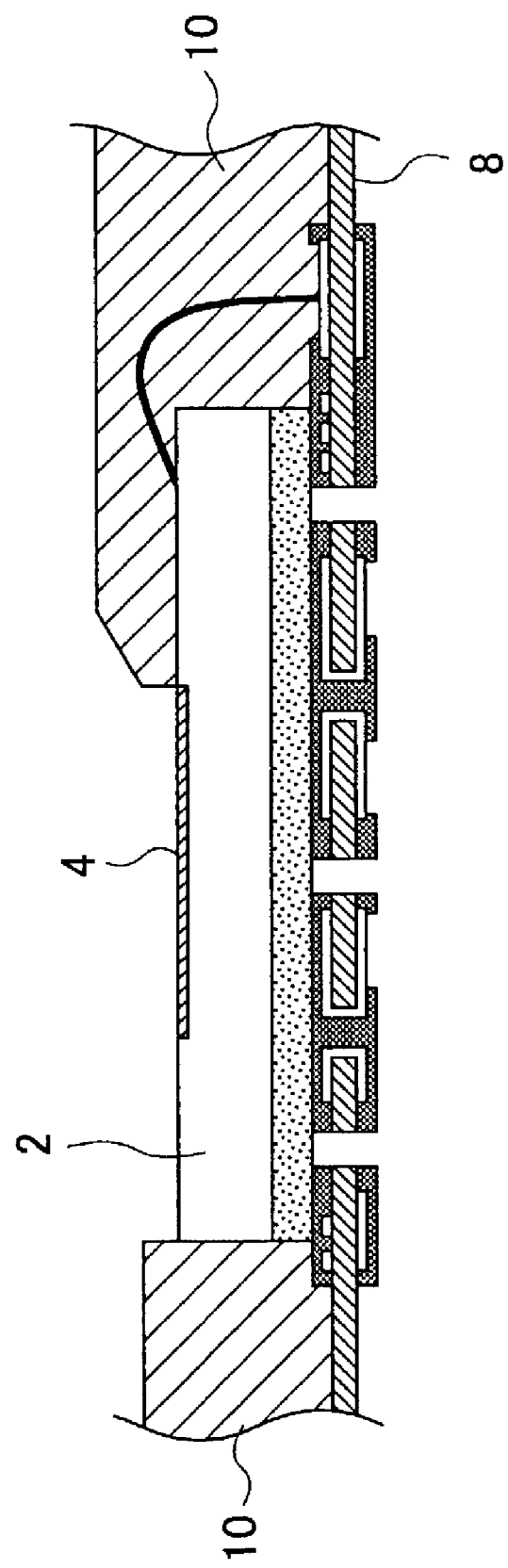
FIG. 12 is a cross-sectional view of a fingerprint sensor apparatus according to a fourth embodiment of the present invention.

A description will now be given, with reference to FIGS. 12 through 14, of a fingerprint sensor apparatus according to a fourth embodiment of the present invention. FIG. 12 is a cross-sectional view of the fingerprint sensor apparatus according to the fourth embodiment of the present invention.

Figure 13:
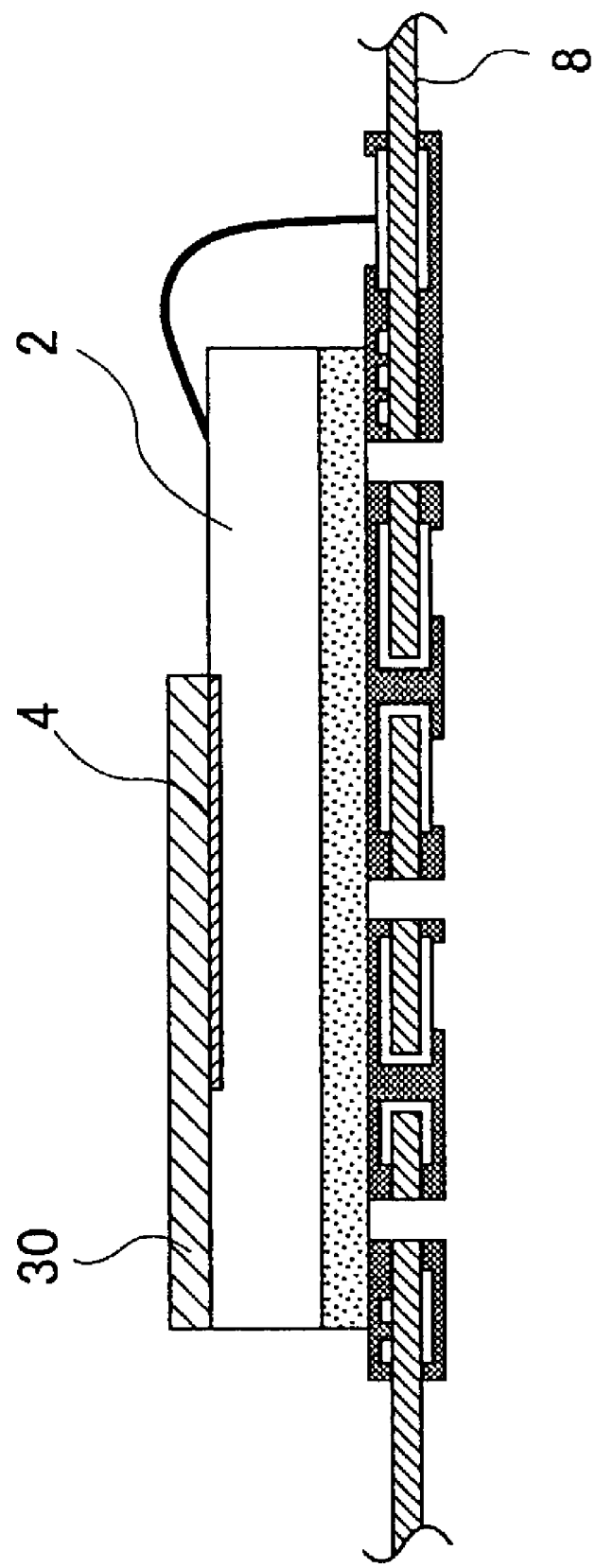
FIG. 13 is a cross-sectional view showing a preparation process before carrying out resin-molding a semiconductor chip in a production process of the fingerprint sensor apparatus shown in FIG. 10.
Figure 14:
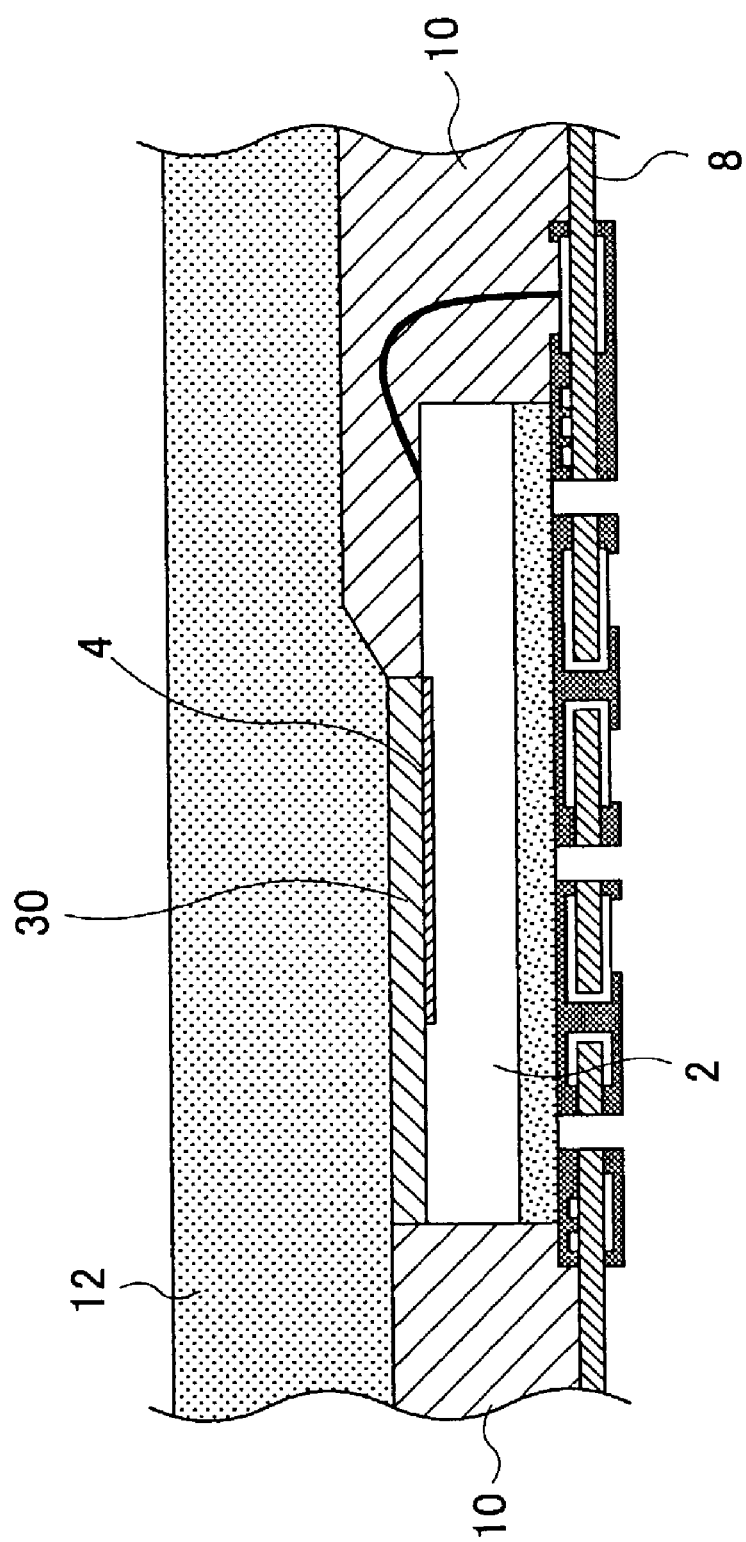
FIG. 14 is a cross-sectional view showing a process of resin-molding a semiconductor chip in the production process of the fingerprint sensor apparatus shown in FIG. 10.

FIG. 13 is a cross-sectional view showing a preparation process before carrying out resin-molding a semiconductor chip in a production process of the fingerprint sensor apparatus shown in FIG. 10 FIG. 14 is a cross-sectional view showing a process of resin-molding a semiconductor chip in a production process of the fingerprint sensor apparatus shown in FIG. 10.

The fingerprint sensor apparatus according to the fourth embodiment of the present invention has a structure in which a portion of the surface of the semiconductor chip 2 is exposed similar to the fingerprint sensor apparatus shown in FIG. 8 so that the sensor part 4 is easily scanned by a finger. However, in the present embodiment, in order to protect the edge of the semiconductor chip 2, the seal resin part 10 is formed slightly higher than the exposed surface of the semiconductor chip 2.

In order to make the surface of the seal resin part 10 slightly higher than the surface of the semiconductor chip 2, as shown in FIG. 13, a protective tape 30 is first applied onto the top surface of the semiconductor chip 2 before carrying out resin-molding. The protective tape 30 is preferably made of a material the same as that of the above-mentioned spacer. Then, as shown in FIG. 14, resin-molding is performed in a state where the protective tape 30 is applied over the sensor part 4 and a part of the surface of the semiconductor chip 2 that is to be exposed. After molding, the protective film 30 is removed by peeling, and the fingerprint sensor apparatus shown in FIG. 12 is completed. Therefore, a difference in height corresponding to the thickness of the protective tape 30 is generated between the top surface of the seal resin part 10 and the top surface of the semiconductor chip 2. Thereby, the edge of the semiconductor chip 2 can be protected.

Figure 15:
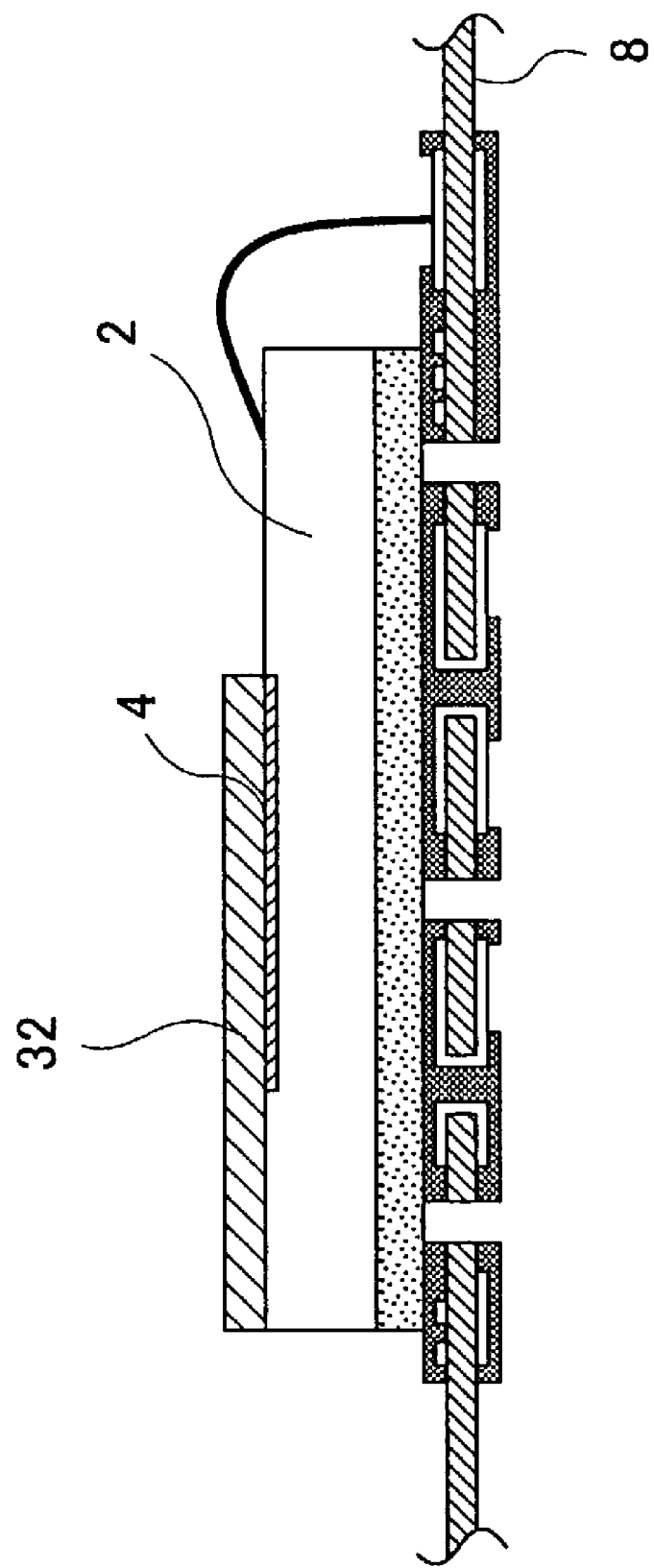
FIG. 15 is a cross-sectional view showing a process of forming a photosensitive resin film before resin-molding a semiconductor chip in a production process of the fingerprint sensor apparatus shown in FIG. 10.

Alternatively, a photosensitive resin may be applied over the sensor part 4 and the top surface of the semiconductor chip 2 instead of the protective tape 30. That is, as shown in FIG. 15, a photosensitive resin film 32 is formed on the sensor part 4 and the part of the surface of the semiconductor chip 2 that is to be exposed. The photosensitive resin film 32 can be formed using a technique to patternize and etch a resist, which is used in a conventional semiconductor chip manufacturing technique.

Figure 16:
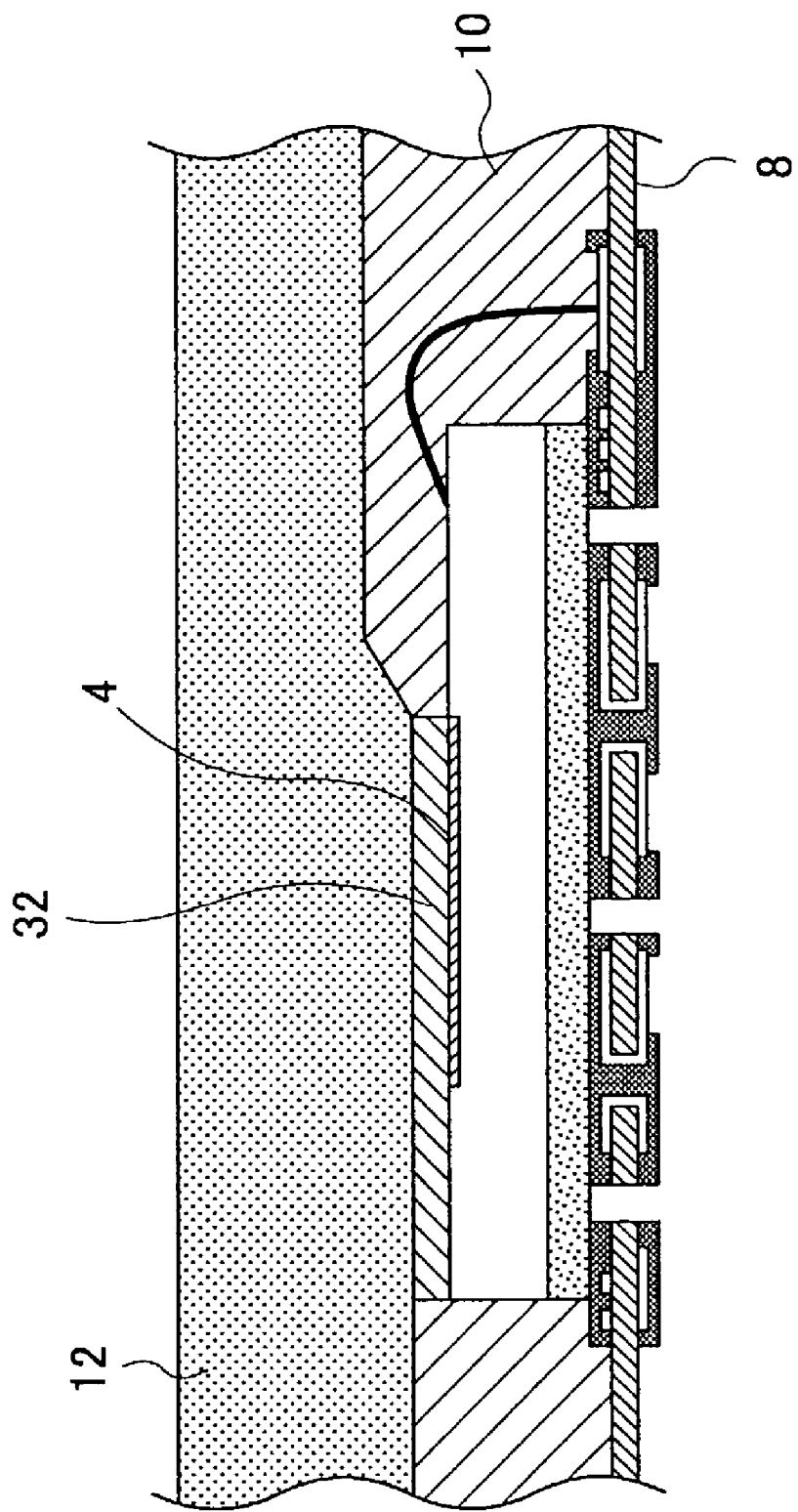
FIG. 16 is a cross-sectional view showing a process of resin-molding a semiconductor chip in a production process of the fingerprint sensor apparatus shown in FIG. 10.

Then, as shown in FIG. 16, resin-molding is performed in a state where the photosensitive resin film 32 is formed over the sensor part and the part of the surface of the semiconductor chip 2 that is to be exposed. After the molding, the photosensitive resin film 32 is removed by being subjected to an exposure and wash as shown in FIG. 17, and the fingerprint sensor apparatus shown in FIG. 12 is completed. Therefore, a difference in height corresponding to the thickness of the photosensitive resin film 32 is generated between the top surface of the seal resin part 10 and the top surface of the semiconductor chip 2. Thereby, the edge of the semiconductor chip 2 can be protected.

The present invention is not limited to the specifically disclosed embodiments, and variations and modifications may be made without departing from the scope of the present invention.

The present application is based on Japanese priority application No. 2002-043708 filed Feb. 20, 2002, the entire contents of which are hereby incorporated by reference.

What is claimed is:

1. A fingerprint sensor apparatus for recognizing a pattern of a fingerprint by being contacted by a finger, comprising:
   a semiconductor chip having a surface on which a sensor part is formed; and
   a seal resin part which encapsulates the semiconductor chip,
   wherein said sensor part is exposed in a bottom of an opening formed in the seal resin part, and a distance between an edge of the bottom of the opening and an edge of said sensor part is 0.3 mm to 0.1 mm, and
   wherein said distance prevents a mold flash from being formed on a surface of said sensor part.

2. A fingerprint sensor apparatus for recognizing a pattern of a fingerprint by being contacted by a finger, comprising:
   a semiconductor chip having a surface on which a sensor part is formed; and
   a seal resin part which encapsulates the semiconductor chip,
   wherein said sensor part is exposed in a bottom of an opening formed in the seal resin part; the bottom of the opening has a step formed by a first surface and a second surface which is higher than the first surface, said sensor part being exposed on said first surface; and a distance between said first surface and said second surface in a direction perpendicular to a surface of the sensor part is 70 μm to 150 μm, and
   wherein said distance prevents a mold flash from being formed on a surface of said sensor part.

3. A fingerprint sensor apparatus for recognizing a pattern of a fingerprint by being contacted by a finger, comprising:
   a semiconductor chip having a surface on which a sensor part is formed; and
   a seal resin part which encapsulates the semiconductor chip,
   wherein said sensor part and a part of a surface of the semiconductor chip are exposed in a bottom of an opening formed in the seal resin part, and a portion of said seal resin part forming said opening in a direction in which the finger is moved is a flat surface within the same plane in which an exposed surface of said semiconductor chip lies.

4. The fingerprint sensor apparatus as claimed in claim 3, wherein a protrusion is formed as a part of said seal resin part, the protrusion extending astride and along a boundary between the exposed surface of said semiconductor chip and said flat surface of said seal resin part.

5. A fingerprint sensor apparatus for recognizing a pattern of a fingerprint by being contacted by a finger, comprising:
   a semiconductor chip having a surface on which a sensor part is formed; and
   a seal resin part which encapsulates the semiconductor chip,
   wherein said sensor part and a part of a surface of the semiconductor chip are exposed in a bottom of an opening formed in the seal resin part, and a portion of said seal resin part forming said opening in a direction in which the finger is moved is lower than other portions of the seal resin part but higher than an exposed surface of said semiconductor chip.

6. A manufacturing method of a fingerprint sensor apparatus for recognizing a pattern of a fingerprint by being contacted by a finger, comprising the steps of:
   attaching a spacer onto a predetermined position of a mold die for resin-molding a semiconductor chip having a surface on which a sensor part is formed, the spacer having a width greater than a width of said sensor part by a predetermined length; and
   placing said semiconductor chip inside the mold die, and resin-molding said semiconductor chip in a state where said spacer covers said sensor part of said semiconductor chip.

7. The manufacturing method as claimed in claim 6, wherein said spacer covers an entire width of said sensor part, and a portion of said spacer extending beyond an edge of said sensor part in a direction of the width is 0.3 mm to 1.0 mm.

8. The manufacturing method as claimed in claim 6, wherein said spacer covers an entire width of said sensor part, and a portion of said spacer extending beyond an edge of said sensor part extends beyond an edge of a surface of said semiconductor chip.

9. A manufacturing method of a fingerprint sensor apparatus for recognizing a pattern of a fingerprint by being contacted by a finger, comprising the steps of:

applying a protective film having a predetermined thickness over a portion of a surface of a semiconductor chip and a sensor part formed on the surface of the semiconductor chip;

placing said semiconductor chip inside said mold die, and resin-molding said semiconductor chip in a state where said protective tape covers the sensor part of said semiconductor chip; and removing said protective film from said semiconductor chip by pealing after the resin-molding so as to expose said sensor part and said portion of the surface of said semiconductor chip.

10. A manufacturing method of a fingerprint sensor apparatus for recognizing a pattern of a fingerprint by being contacted by a finger, comprising the steps of:

forming a photosensitive resin film having a predetermined thickness over a portion of a surface of a semiconductor chip and a sensor part formed on the surface of the semiconductor chip;

placing said semiconductor chip inside said mold die, and resin-molding said semiconductor chip in a state where said photosensitive resin film covers the sensor part of said semiconductor chip; and removing said protective film from said semiconductor chip by exposure after the resin-molding so as to expose said sensor part and said portion of the surface of said semiconductor chip.

* * * * *